(12) United States Patent
Shindo et al.

(10) Patent No.: US 8,668,785 B2
(45) Date of Patent: Mar. 11, 2014

(54) HIGH PURITY YTTERBIUM, SPUTTERING TARGET MADE THEREOF, THIN FILM CONTAINING THE SAME, AND METHOD OF PRODUCING THE SAME

(75) Inventors: Yuichiro Shindo, Ibaraki (JP); Kazuto Yagi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 533 days.

(21) Appl. No.: 12/739,011

(22) PCT Filed: Sep. 24, 2008

(86) PCT No.: PCT/JP2008/067149
§ 371 (c)(1),
(2), (4) Date: Apr. 21, 2010

(87) PCT Pub. No.: WO2009/054217
PCT Pub. Date: Apr. 30, 2009

(65) Prior Publication Data
US 2010/0260640 A1    Oct. 14, 2010

(30) Foreign Application Priority Data
Oct. 23, 2007  (JP) ................................ 2007-274808

(51) Int. Cl.
*C22C 28/00*  (2006.01)
*C23C 14/00*  (2006.01)

(52) U.S. Cl.
USPC ..................... 148/400; 420/416; 204/298.13

(58) Field of Classification Search
USPC ............... 420/416; 75/392, 610; 204/298.13; 148/400
See application file for complete search history.

(56) References Cited

U.S. PATENT DOCUMENTS

| | | | |
|---|---|---|---|
| 6,946,039 B1 * | 9/2005 | Segal et al. | ............... 148/400 |
| 2005/0167766 A1 | 8/2005 | Yagishita | |
| 2010/0044223 A1 | 2/2010 | Tsukamoto | |

FOREIGN PATENT DOCUMENTS

| | | | |
|---|---|---|---|
| JP | 61-009533 A | | 1/1986 |
| JP | 62-047438 A | | 3/1987 |
| JP | 63-011628 A | | 1/1988 |
| JP | 63-282218 A | | 11/1988 |
| JP | 01-104727 A | | 4/1989 |
| JP | 01104727 A | * | 4/1989 |
| JP | 01-126222 A | | 5/1989 |
| JP | 07-090410 A | | 4/1995 |
| JP | 07-090411 A | | 4/1995 |
| JP | 08-085833 A | | 4/1996 |

OTHER PUBLICATIONS

Fukuda et al., English translation of JP 01-104727A, Apr. 21, 1989, whole document.*
Gvelesiani et al., "Lantano-I Tseriyetermicheskoye Vosstanovleniye Okisis Itterbiya", 1967, Izvestiya Akademii Nauk SSSR, Metally, 1, 213-218 (original Russian copy).*
Gvelesiani et al., English translation of "Lanthanum and Cerium Thermal-Reduction of Ytterbium Oxide", 1967, Izvestiya Akademii Nauk SSSR Metally, 1, whole document (English translation).*

* cited by examiner

Primary Examiner — Roy King
Assistant Examiner — Caitlin Kiechle
(74) Attorney, Agent, or Firm — Howson & Howson LLP

(57) ABSTRACT

Provided is a method of producing high purity ytterbium, wherein the high purity ytterbium is obtained by reducing crude ytterbium oxide in a vacuum with reducing metals composed of metals having a low vapor pressure, and selectively distilling ytterbium. Additionally provided are methods of achieving the high purification of ytterbium which has a high vapor pressure and is hard to refine in a molten state, and high purity ytterbium obtained thereby. Further provided is technology for efficiently and stably obtaining a sputtering target made of high purity material ytterbium, and a thin film for metal gates containing high purity material ytterbium.

4 Claims, No Drawings

HIGH PURITY YTTERBIUM, SPUTTERING TARGET MADE THEREOF, THIN FILM CONTAINING THE SAME, AND METHOD OF PRODUCING THE SAME

BACKGROUND OF THE INVENTION

The present invention relates to high purity ytterbium (Yb), a sputtering target made of high purity ytterbium, a thin film containing high purity ytterbium, and a method of producing high purity ytterbium.

Ytterbium (Yb) is a rare-earth element, and is contained in the earth's crust as a mixed composite oxide mineral resource. Rare-earth elements are named after because they are separated from relatively rare minerals, but they are not that rare in light of the overall earth's crust.

Ytterbium is a gray metal having an atomic number of 70 and an atomic weight of 173.0, and comprises a cubic close-packed structure at normal temperature. Ytterbium has a melting point of 819° C., boiling point of 1194° C., density of 6.97 g/cm$^3$, its surface is oxidized in the atmosphere, and is also soluble in acid. With rare-earth elements, compounds having an oxidation number of 3 are generally stable, and ytterbium is also trivalent, but certain rare-earth elements are bivalent. The present invention covers all of the above.

In recent years, research and development for using ytterbium as a metal gate material and an electronic material for High-k use are being promoted, and ytterbium is a metal that is catching attention.

Nevertheless, ytterbium metal is a material which has a high vapor pressure and is hard to refine, and contains large amounts of volatile elements and the like as impurities. Accordingly, there is a problem in that it is not possible to adopt the process of refining ytterbium in a vacuum as with ordinary metal refining.

Conventionally, since no consideration was given to using ytterbium as an electronic component, documents related to the practical extraction method of ytterbium are limited. Only certain references were made as a part of extraction of rare earth metals, and these are introduced below.

In a method of producing the rare earth elements of Sm, Eu, Yb by mixing the oxide powders of Sm, Eu, Yb with misch metal to obtain a briquette shape, and reducing this with the vacuum thermal reduction method with misch metal as the reducing agent, disclosed is technology for subjecting misch metal to hydrotreatment in advance to obtain powdered hydrogenated misch metal, mixing this to obtain a briquette shape, and thereby preventing the oxidation/combustion during the granulation process of misch metal (for instance, refer to Patent Document 1).

In the foregoing case, although there is devisal in the use of the misch metal as the reducing agent, there is contamination from the misch metal and atmospheric contamination in the production process, and there is a problem in that high purification is difficult.

Additionally proposed is technology for reducing halide as a rare earth with calcium or calcium hydride, and, upon separating the obtained rare earth metal and the slag, placing a slag separating jib in the melted slag, solidifying the slag, and eliminating the slag together with the jig.

As the rare earths, lanthanum, cerium, praseodymium, and neodymium are selected (for example, refer to Patent Document 2). Nevertheless, since this technology is unable to sufficiently eliminate the slag, there is a problem in that it is difficult to achieve high purity.

Additionally disclosed is a method of producing rare earth metals based on the thermal reduction method of adding a reducing agent to the fluoride raw material as the rare earth metal and heating this at high temperature, wherein proposed is using a mixed composition of fluoride as the rare earth metal and lithium fluoride as the raw material, or adding one or more types of barium fluoride and calcium fluoride thereto. In the foregoing case, proposed is the use of a fused salt electrolytic solvent bath, and it is disclosed that the oxygen content will thereby 1000 ppm (for example, refer to Patent Document 3).

This technology is based on the use of a fused salt electrolytic bath, and there are problems in that it requires a complicated process and the effect of eliminating oxygen is insufficient. Moreover, there is a problem in that the used lithium, barium, calcium and the like will be accompanied as impurities.

Additionally proposed is a process of mixing a mixed composition of fluoride as the rare earth metal and lithium fluoride or a mixed composition in which one or more types of barium fluoride and calcium fluoride is added thereto, and rare earth metals, and extracting the rare earths based on heating and melting, wherein commercially available thermally reduced rare earths are used as the foregoing rare earths, and fused salt electrolysis for producing an alloy of the rare earth metals and iron group transition metals as the mixed composition.

Further disclosed is that, consequently, it is possible to obtain high purity rare earth metals in which the oxygen content is 300 ppm or less, and having few impurities such as calcium, lithium, and fluorine (for example, refer to Patent Document 4). This technology is also based on the use of a fused salt electrolytic bath, and there are problems in that it requires a complicated process and the effect of eliminating oxygen is insufficient. Moreover, there is a problem in that the used lithium, barium, calcium and the like will be accompanied as impurities.

Additionally proposed is a refining method of obtaining high purity rare elements by adding Mg or Zn to Ta-containing rare earth metals as impurities, melting this in a crucible, subsequently solidifying this, eliminating the high Ta-containing portion existing at the bottom of the crucible, and distilling the low Ta-containing portion in a vacuum (for example, refer to Patent Document 5). Since there are problems in that the added metals will be accompanied as impurities and the elimination of Ta is insufficient, the level of high purification still remains low.

As shown in the foregoing Documents, the refining effect of ytterbium is not necessarily sufficient, and there is a problem in that documents that seek the reduction of oxygen are limited, and that, even if sought, the reduction is insufficient.

Moreover, technologies that use fused salt electrolysis entail complicated and costly processes, and there is also a problem in that the refining effect is insufficient. Thus, the current situation is that there is no technology that is capable of efficiently and stably producing high purity ytterbium which has a high vapor pressure and is hard to refine in a molten state.

[Patent Document 1] Publication of Japanese Unexamined Application No.S61-9533

[Patent Document 2] Publication of Japanese Unexamined Application No.S63-11628

[Patent Document 3] Publication of Japanese Unexamined Application No.H7-90410

[Patent Document 4] Publication of Japanese Unexamined Application No.H7-90411

[Patent Document 5] Publication of Japanese Unexamined Application No. H8-85833

SUMMARY OF THE INVENTION

Thus, an object of the present invention is to provide technology for efficiently and stably obtaining high purity ytterbium metal, a sputtering target made of high purity ytterbium, and a thin film for metal gates containing high purity material ytterbium, and achieving the high purification of ytterbium which has a high vapor pressure and is hard to refine in a molten state.

In order to achieve the foregoing object, as a result of intense study, the present inventors discovered a method of producing high purity ytterbium in which high purity ytterbium can be obtained by heating ytterbium oxide in a vacuum together with reducing metals, and reducing the product with reducing metals and simultaneously distilling the same.

In the foregoing thermal reduction, the ytterbium oxide and the reducing metals may be mixed in advance, and then heated in order to perform the reduction and distillation of ytterbium, or the ytterbium oxide may be heated, and reducing metals may be placed therein and mixed in order to perform the reduction and distillation of ytterbium. Since this is an issue regarding the reactivity of ytterbium oxide and the reducing metals, an efficient method may be suitably selected.

Here, the term "reducing metals" refers to metals which have a stronger oxidation power than ytterbium but a lower vapor pressure than ytterbium. In the present invention, all reducing metals corresponding to the above may be used.

The ytterbium obtained from the foregoing distillation is melted under a reducing atmosphere or an inert atmosphere having an atmospheric pressure of 1 to 100, preferably an atmospheric pressure of 2 to 10, and solidified under diminished pressure as need to obtain an ingot. This ingot is cut into a prescribed size and subject to polishing to obtain a sputtering target.

As the raw material to be used in the present invention, a ytterbium oxide raw material having a purity of 2N or higher and less than 4N is used. As a result or repeating the refining process, it is also possible to use an ytterbium oxide raw material having a purity of 90% or higher. Moreover, based on the method of producing high purity ytterbium, this can be refined to obtain high purity ytterbium having a purity of 4N or higher.

Accordingly, the present invention is able to provide high purity ytterbium in which the purity excluding rare earth elements and gas components is 4N or higher, and each element of alkali metals and alkali earth metals is 50 wtppm or less, respectively. In addition, it is possible to provide high purity ytterbium in which the oxygen content thereof is 200 wtppm or less.

Each element of the foregoing alkali metals and alkali earth metals are problematic elements when used as an electronic material, especially as a metal gate material, as shown below, and reducing these elements is important. Conventionally, since technology of using ytterbium as is was extremely limited, it could be said that no technology has aimed to eliminate the respective elements of alkali metals and alkali earth metals therein. The present invention is able to achieve this.

As described above, alkali metal elements include sodium (Na), potassium (K), lithium (Li), rubidium (Rb), cesium (Cs), and francium (Fr), and these are electrically positive, and those having a small atomic radius are easily transferred among elements, and will become problematic elements when used as an electronic material; specifically as a metal gate material. Accordingly, it is necessary to limit the amount of inclusion to be 50 wtppm or less, respectively.

Alkali earth metal elements include calcium (Ca), strontium (Sr), barium (Ba), and radium (Ra), and, as with the alkali metal elements, these are also electrically positive and show the same behavior as the alkali metal elements. Thus, it is necessary to limit the amount of inclusion to be 50 wtppm or less, respectively.

In addition, the ytterbium raw material includes transition metals of elements of groups 3 to 11 of the periodic table as well as radioactive elements such as uranium and thorium. As representative transition metal elements, there are titanium, vanadium, chromium, manganese, iron, cobalt, nickel, copper, and zinc, and are known to induce increase in the leak current and cause the deterioration in the withstanding pressure. Moreover, as representative radioactive elements, there are uranium and thorium, but it is necessary to limit the alpha dose that is generated from these elements because the accumulated charge of a memory cell will be inverted and cause soft errors.

Nevertheless, these elements can be easily eliminated during the distillation and refining process of the present invention. Accordingly, in the production method of the present invention, it is easy to keep each element of transition metals in the high purity ytterbium to be 50 wtppm or less, even 10 wtppm or less, and the respective radioactive elements to be 10 wtppb or less, and even 1 wtppb or less, respectively. These elements will not cause problems as impurities.

Upon forming a thin film of an electronic material such as a gate insulation film or a thin film for metal gates, sputtering is often performed, which is a superior method of forming the thin film. Accordingly, it is effective to use the foregoing ytterbium ingot to produce a high purity ytterbium sputtering target.

Upon producing a target, the foregoing high purity ytterbium ingot is cut into a prescribed size, and subsequently ground and polished. Consequently, it is possible to produce a high purity target of the same composition.

As a result of sputtering the target obtained as described above, it is possible to form a thin film having the same composition as the foregoing sputtering target or containing high purity ytterbium of the same level of purity as the sputtering target on a substrate. The target composition is passed on in the film on the substrate, and a high purity ytterbium film can be formed.

For use as a metal gate film, the composition of the foregoing high purity ytterbium may be used as is, but it is also possible to mix the high purity ytterbium with another gate material, or form the high purity ytterbium as an alloy or compound. In the foregoing case, this can be achieved by performing simultaneous sputtering with the target of the other gate material, or sputtering a mosaic target or an alloy target. The present invention covers all of the above.

The content of impurities will vary depending on the impurity content contained in the raw material, but as a result of adopting the foregoing method, the respective impurities can be adjusted to be within the foregoing numerical range.

The present invention provides a method of achieving the high purification of ytterbium, high purity ytterbium obtained thereby, and technology for efficiently and stably obtaining a sputtering target made of high purity material ytterbium, and a thin film for metal gates containing high purity material ytterbium.

The present invention yields a superior effect of providing a method of achieving the high purification of ytterbium which has a high vapor pressure and is hard to refine in a molten state, and high purity ytterbium obtained thereby, as well as a technology for efficiently and stably obtaining a sputtering target made of high purity material ytterbium, and a thin film for metal gates having high purity material ytterbium as their primary component.

DETAILED DESCRIPTION OF THE INVENTION

The present invention may use crude ytterbium oxide as the ytterbium raw material to be subject to high purification. These raw materials, excluding rare earth elements, have a purity level of 1 to 3N and contain such as Na, K, Fe, Cr, Ni, O, C and N as primary impurities.

Particularly problematic are, as described above, alkali metal elements and alkali earth elements contained in the crude ytterbium oxide as the raw material. Among the above, alkali metals are elements that are hard to eliminate at the stage of refining ytterbium, because they are contained in a large quantity and have a similar vapor pressure to ytterbium.

Alkali metal elements and alkali earth elements are electrically positive, and those having a small atomic radius are easily transferred among elements, and there is a problem in that the characteristics of that element will become unstable. Although a small amount thereof included is not a problem, the large amounts of alkali metal elements cause the deterioration in the characteristics of the elements as described above when used as an electronic material, and must be avoided.

The ytterbium oxide is mixed with a metal of a reducing character, and thermally reduced in a vacuum at 600 to 1800° C. Although lanthanum (La) is effective as the metal of a reducing character, it is also possible to additionally use Y, Gd, Nd, Pr or the like. If the reduction temperature is less than 600° C., reduction will be insufficient, and if it exceeds 1800° C., there will be energy loss. Thus, it is desirable to perform the heating in a vacuum at 600 to 1600° C.

This temperature can be arbitrarily selected based on the purity of the ytterbium oxide and the type of metal to be used as the reducing agent, and there is no particular limitation in the setting of the temperature conditions.

Pursuant to the advancement of reduction of the ytterbium oxide, ytterbium is distilled and ytterbium with improved purity is stored in a capacitor unit. Distillates are eliminated from the capacitor and placed in a crucible. The distillates are melted in the crucible and solidified to obtain an ingot. Preferably, the operation of the foregoing melting and solidification process is performed under slight pressure; specifically, a reducing atmosphere ($H_2$ or the like) or an inert atmosphere (Ar, He or the like) having an atmospheric pressure of 1 to 100. It is thereby possible to prevent the increase of oxygen. More efficiently, it is preferably to perform the foregoing process at an atmospheric pressure in a range of 2 to 10.

It is thereby possible to produce high purity ytterbium, wherein the purity excluding rare earth elements and gas components is 4N or higher, oxygen content is 200 wtppm or less, each element of alkali metals and alkali earth metals is 50 wtppm or less, each element of transition metals are 50 wtppm or less, and each radioactive element is 10 wtppb or less, each element of alkali metals and alkali earth metals is 50 wtppm or less, respectively. As described above, since the transition metals and radioactive elements can be easily eliminated, there will be no problematic elements.

Since the rare earth elements have similar chemical characteristics to ytterbium, they are elements which are hard to eliminate with the refining method of the present invention. Nevertheless, since their characteristics as an electronic material are similar to ytterbium, it is not a problem even when they are contained in the ytterbium. Accordingly, the purity level of ytterbium is excluded from 4N.

With respect to the gas components, they are generally excluded from the purity of elements upon defining the purity, and the present invention also provides a purity indication of ytterbium having a purity of 4N or higher excluding gas components. With the ytterbium of the present invention, the content of oxygen as a gas component is preferably 200 wtppm or less. This is because if oxygen gets mixed into the ytterbium sputtering target, splashes and particles caused by the oxygen will be generated in the sputtering process, and will affect the uniformity of deposition.

As a result of preparing a high purity target using the foregoing high purity ytterbium and additionally sputtering the target, high purity ytterbium can be deposited onto a substrate.

Target can be produced in ordinary processes such as forging, rolling, cutting, finishing (polishing). There is no particular limitation in the production process, and it may be arbitrarily selected.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

In Example 1, 2N level ytterbium oxide was used as the ytterbium raw material. The impurities contained in this raw material are shown in Table 1. The raw material contained large amounts of alkali metals; specifically, 220 wtppm of sodium (Na), 110 wtppm of potassium (K), and 1600 wtppm of lithium (Li).

Subsequently, this was mixed with lanthanum (La) as a metal of a reducing character, and thermally reduced in a vacuum at 1020° C. Pursuant to the advancement of reduction of the ytterbium oxide, ytterbium became distilled and the purity improved, and ytterbium was stored in a capacitor unit in which the temperature was set to 200 to 600° C.

The reaction of distillation thermal reduction was as follows:

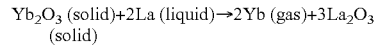
$Yb_2O_3$ (solid)+2La (liquid)→2Yb (gas)+3$La_2O_3$ (solid)

With the foregoing capacitor, 20 kg of stored ytterbium distillate was obtained. The distilled ytterbium has different impurity content in the temperature ranges A to C of the capacitor. Technically, it could be said that ytterbium distillate with even more diversified purity can be obtained if the temperature range of the capacitor is divided more precisely.

The purity depends on the structure of the distillation apparatus, but if the same distillation apparatus is used, high purity ytterbium having approximately the same constitution can be obtained. This can be confirmed based on analysis. The analytical results of average impurities of alkaline elements and alkali earth elements in the respective ranges, upon dividing the temperature range of the capacitor to A to C, are shown in Table 1.

In the analysis of impurities besides the above, there were 180 wtppm of oxygen (O), 30 wtpmm of carbon (C) and 30 wtppm of nitrogen (N) contained as gas components; 6 wtppm of iron (Fe), 0.5 wtppm of chromium (Cr), and <0.1 wtppm of nickel (Ni) as transition metals; and <0.001 wtppm of uranium (U) and <0.001 wtppm of thorium (Th) as radioactive elements. The elimination of these impurity elements will be explained later.

TABLE 1

|  | elements | | | temperature range |
|---|---|---|---|---|
|  | Na | K | Li | of capacitor (° C.) |
| raw material | 220 | 110 | 1600 | — |
| A | 0.8 | 24 | 1.3 | 200~300 |
| B | 7 | 10 | 17 | 300~500 |
| C | 35 | 1.7 | 42 | 500~600 |

(unit: wtppm)

As shown in Table 1, temperature range A is 200 to 300° C., temperature range B is 300 to 500° C., and temperature range C is 500 to 600° C. The analytical results of sodium, potassium, and lithium impurities in the foregoing temperature ranges are shown. Other than those, alkaline elements and alkali earth elements were less than 0.1 ppm, thus they have been omitted from Table 1.

As shown in Table 1, it was possible to considerably reduce the large amounts of alkali metals that were contained during the raw material phase, and all cases of Example 1 (A to C of Table 1) satisfied the requirements of the present invention. As the condensates, most condensates were in range B.

Upon melting ytterbium, the respective condensates of foregoing ytterbium A to C were introduced into a crucible; the ytterbium was melted in the crucible at 950° C., and subsequently solidified to obtain an ingot having the impurities of A to C. The operation of melting and solidification was performed at an atmospheric pressure of 6 under an Ar atmosphere.

As a result of arbitrarily mixing and melting the respective ytterbium distillates from ranges A, to C having a different impurity content, ytterbium having different impurities of A to C can be obtained. Moreover, by mixing and melting ytterbium having different purities of A to C, it is also possible to obtain ytterbium having an average purity based on the mixing result.

Thus it is possible to produce high purity ytterbium capable of achieving the object of the present invention; specifically, high purity ytterbium, wherein the purity excluding rare earth elements and gas components is 4N or higher, and each element of alkali metal and alkali earth metals is 50 wtppm or less, respectively.

The sputtering target obtained from the ingots A to C was able to similarly maintain high purity, and, by sputtering the foregoing target, it was possible to form a high purity ytterbium thin film having uniform characteristics on the substrate.

Example 2

As with Example 1, 2N level ytterbium oxide was used. Subsequently, this was mixed with yttrium (Y) as a metal of a reducing character, and thermally reduced in a vacuum at 1600° C. Pursuant to the advancement of reduction of the ytterbium oxide, ytterbium became distilled and the purity improved, and ytterbium was stored in a capacitor unit in which the temperature was set to 200 to 600° C.

The reaction of distillation thermal reduction was as follows.

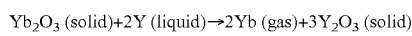

As with Example 1, from the distilled ytterbium, it was possible to obtain ytterbium distillates having a different impurity content in the temperature ranges A to C of a capacitor.

The analytical results of average impurities of alkaline elements and alkali earth elements in the respective ranges, upon dividing the temperature range of the capacitor to A to C, are shown in Table 2.

In the analysis of impurities besides shown above, there were 50 wtppm of oxygen (O), 70 wtppm of carbon (C) and <10 wtppm of nitrogen (N) contained as gas components; 25 wtppm of iron (Fe), 6 wtppm of chromium (Cr), and 10 wtppm of nickel (Ni) as transition metals; and <0.001 wtppm of uranium (U) and <0.001 wtppm of thorium (Th) as radioactive elements.

TABLE 2

|  | elements | | | temperature range |
|---|---|---|---|---|
|  | Na | K | Li | of capacitor (° C.) |
| raw material | 220 | 110 | 1600 | — |
| A | 12 | 45 | 3 | 200~300 |
| B | 35 | 12 | 26 | 300~500 |
| C | 50 | 6 | 50 | 500~600 |

(unit: wtppm)

As shown in Table 2, temperature range A is 200 to 300° C. approximately, temperature range B is 300 to 500° C. approximately, and temperature range C is 500 to 600° C. approximately. The analytical results of sodium, potassium, and lithium impurities in the foregoing temperature ranges are shown. Other than those, alkaline elements and alkali earth elements were less than 0.1 ppm, thus they have been omitted from Table 2, as with Example 1.

As shown in Table 2, it was possible to considerably reduce the large amounts of alkali metals contained during the raw material phase, and all cases of Example 2 (A to C of Table 2) satisfied the requirements of the present invention.

Upon melting ytterbium, the respective condensates of foregoing ytterbium A to C were introduced into a crucible, the ytterbium was melted in the crucible at 850° C., and subsequently solidified to obtain an ingot having the impurities of A to C. The operation of melting and solidification was performed at an atmospheric pressure of 3 under a $H_2$ atmosphere.

In addition, the sputtering target obtained from the ingots A to C was able to similarly maintain high purity as with Example 1, and, by sputtering the foregoing target, it was possible to form a high purity ytterbium thin film having uniform characteristics on the substrate.

Example 3

In Example 3, 3N level ytterbium oxide was used. Subsequently, this was mixed with neodymium (Nd) as a metal of a reducing character, and thermally reduced in a vacuum at 1200° C. Pursuant to the advancement of reduction of the ytterbium oxide, ytterbium became distilled and the purity improved, and ytterbium was stored in a capacitor unit in which the temperature was set to 200 to 600° C.

The reaction of distillation thermal reduction was as follows.

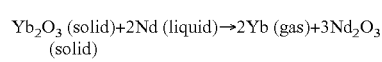

As with Example 1, from the distilled ytterbium, it was possible to obtain ytterbium distillates having a different impurity content in the temperature ranges A to C of a capacitor.

The analytical results of average impurities of alkaline elements and alkali earth elements in the respective ranges, upon dividing the temperature range of the capacitor to A to C, are shown in Table 3.

In the analysis of impurities besides the above, there were 150 wtppm of oxygen (O), 10 wtppm of carbon (C) and 10 wtppm of nitrogen (N) contained as gas components; 40 wtppm of iron (Fe), 12 wtppm of chromium (Cr), and 25 wtppm of nickel (Ni) as transition metals; and <0.001 wtppm of uranium (U) and <0.001 wtppm of thorium (Th) as radioactive elements.

TABLE 3

|  | elements | | | temperature range |
|---|---|---|---|---|
|  | Na | K | Li | of capacitor (° C.) |
| raw material | 15 | 7 | 80 | — |
| A | <0.1 | 3.6 | 0.1 | 200~300 |
| B | 1.0 | 0.6 | 1.3 | 300~500 |
| C | 5.5 | <0.6 | 4.0 | 500~600 |

(unit: wtppm)

As shown in Table 3, temperature range A is 200 to 300° C. approximately, temperature range B is 300 to 500° C. approximately, and temperature range C is 500 to 600° C. approximately. The analytical results of sodium, potassium, and lithium impurities in the foregoing temperature ranges are shown. Other than those, alkaline elements and alkali earth elements were less than 0.1 ppm, thus they have been omitted from Table 3, as with Example 1.

As shown in Table 3, it was possible to considerably reduce the large amounts of alkali metals contained during the raw material phase, and all cases of Example 3 (A to C of Table 3) satisfied the requirements of the present invention.

Upon melting ytterbium, the respective condensates of foregoing ytterbium A to C were introduced into a crucible; the ytterbium was melted in the crucible at 850° C., and subsequently solidified to obtain an ingot having the impurities of A to C. The operation of melting and solidification was performed at an atmospheric pressure of 3 under a $H_2$ atmosphere.

In the analysis of impurities besides the above, there were 70 wtppm of oxygen (O), 10 wtppm of carbon (C) and 10 wtppm of nitrogen (N) contained as gas components; 1.0 wtppm of iron (Fe), 0.4 wtppm of chromium (Cr), and 2.5 wtppm of nickel (Ni) as transition metals; and <0.001 wtppm of uranium (U) and <0.001 wtppm of thorium (Th) as radioactive elements.

Upon melting ytterbium, the respective condensates of foregoing ytterbium A to C were introduced into a crucible, the ytterbium was melted in the crucible at 1200° C., and subsequently solidified to obtain an ingot having the impurities of A to C. The operation of melting and solidification was performed at an atmospheric pressure of 3 under an Ar atmosphere. In addition, the sputtering target obtained from the ingots A to C was able to similarly maintain high purity as with Example 1, and, by sputtering the foregoing target, it was possible to form a high purity ytterbium thin film having uniform characteristics on the substrate.

Comparative Example 1

As with Example 1, 2N level ytterbium oxide was used. This was subsequently mixed with aluminum (Al). Although the same processes as with the Examples were performed, hardly any reduction was achieved.

The method of producing high purity ytterbium according to the present invention yields a superior effect of being able to resolve the conventional method which had difficulty in achieving the high purification of ytterbium, which has a high vapor pressure and is hard to refine in a molten state, and the high purification of ytterbium can be realized easily. In addition to providing a specific method of the above, the present invention additionally yields a superior effect of providing a technology for efficiently and stably obtaining the high purity ytterbium obtained based on the foregoing method, as well as a sputtering target made of high purity material ytterbium, and a thin film for metal gates having high purity material ytterbium as their primary component. In particular, since the present invention will not deteriorate or disturb the function of electronics as an electronic material that is disposed in the vicinity of a silicon substrate, the present invention is useful to such a material of a gate insulation film, and thin film for metal gates.

The invention claimed is:

1. A sputtering target made of high purity ytterbium, said high purity ytterbium having a purity of 4N (99.99%) or higher excluding rare earth elements and gas components, and a content of impurities of each element of alkali metal elements and alkali earth metal elements of 50 wtppm or less.

2. The sputtering target made of the high purity ytterbium according to claim 1, wherein the oxygen content is 200 wtppm or less.

3. A sputtered thin film comprising high purity ytterbium having a purity of 4N (99.99%) or higher excluding rare earth elements and gas components, and a content of impurities of each element of alkali metal elements and alkali earth metal elements of 50 wtppm or less.

4. A sputtered thin film comprising high purity ytterbium having a purity of 4N (99.99%) or higher excluding rare earth elements and gas components, and a content of impurities of each element of alkali metal elements and alkali earth metal elements of 50 wtppm or less, wherein an impurity oxygen content of the high purity ytterbium is 200 wtppm or less.

* * * * *